United States Patent
Mehrad et al.

(10) Patent No.: US 6,677,766 B2
(45) Date of Patent: Jan. 13, 2004

(54) SHALLOW TRENCH ISOLATION STEP HEIGHT DETECTION METHOD

(75) Inventors: Freidoon Mehrad, Plano, TX (US); Kayvan Sadra, Addison, TX (US); Yaojian Leng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 43 days.

(21) Appl. No.: 10/044,083

(22) Filed: Oct. 26, 2001

(65) Prior Publication Data

US 2002/0060575 A1 May 23, 2002

Related U.S. Application Data

(60) Provisional application No. 60/247,414, filed on Nov. 10, 2000.

(51) Int. Cl.$^7$ .......................... G01R 27/08; G01R 31/26
(52) U.S. Cl. .................. 324/699; 324/719; 324/766; 324/71.5; 438/14; 438/17
(58) Field of Search ................. 324/699, 693, 324/691, 671, 716, 713, 765, 719, 766; 438/586, 14, 17, 248, 245, 246, 391, 700, 696, 294

(56) References Cited

U.S. PATENT DOCUMENTS

| 4,402,127 A | * | 9/1983 | Pham et al. ................ 438/13 |
| 5,914,611 A | * | 6/1999 | Cheng ........................ 324/719 |
| 6,251,749 B1 | * | 6/2001 | Kuroda et al. ............. 438/426 |

* cited by examiner

Primary Examiner—N. Le
Assistant Examiner—Donald M Lair
(74) Attorney, Agent, or Firm—Peter K. McLarty; W. James Brady, III; Frederick J. Telecky, Jr.

(57) ABSTRACT

A method for measuring the step height of a STI structure is described. The method involves measuring the change in resistance of a polysilicon structure as the step height changes. The resistance of the polysilicon structure is measured by applying a voltage and measuring the resulting current.

6 Claims, 3 Drawing Sheets

SHALLOW TRENCH ISOLATION STEP HEIGHT DETECTION METHOD

This application claims priority under 35 USC §119(e)(1) of provisional application Ser. No. 60/247,414, filed Nov. 10, 2000.

FIELD OF THE INVENTION

This invention relates generally to the field of electronic devices and more particularly to method for detecting the step height of shallow trench isolation structures.

BACKGROUND OF THE INVENTION

Shallow trench isolation (STI) has become a main isolation method for making micro/nano-electronic circuits in recent years. Forming STI structures on a semiconductor wafer involves the use of chemical mechanical polishing (CMP). CMP is used to reduce the height of the STI structures across the wafer forming to form a planar surface with the surface of the wafer. Due to differences in the density of these STI structures across the wafer, CMP sometimes results in non-uniform reduction in the step height of the STI structures. In some instances over polishing or dishing is obtained while in other cases under polishing results in a large step height between the top of the remaining STI structure and the surface of the wafer. Processing techniques such as patterned etch back and the use of highly selective polishing slurries have helped to reduce the step height remaining after CMP. Regardless of the CMP method used it is critical that an accurate measure of the remaining step height be obtained for integrated circuit diagnostics and CMP process control. Current methods of measuring the step height include cross-section SEM/TEM and atomic force microscopy (AFM). These techniques are either destructive (SEM/TEM) or time consuming (AFM). There is therefore a need for a sensitive nondestructive method that will accurately determine the STI step height.

SUMMARY OF THE INVENTION

The instant invention is a method of determining the step height of a STI structure. The method requires fabricating a novel polysilicon sidewall structure and measuring the electrical resistance of the structure. Using the relationship between the step height and the measured resistance, the step height can be determined. A major advantage of the instant invention is that the polysilicon sidewall structure self adjusts to the step height of STI structure. This enables the formation of the polysilicon sidewall structure to be integrated into existing device process steps. No additional processing step are required.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

FIGS. 1 through 6 illustrates various aspects of a device and method for determining the step height of a STI structure.

Figure 1:
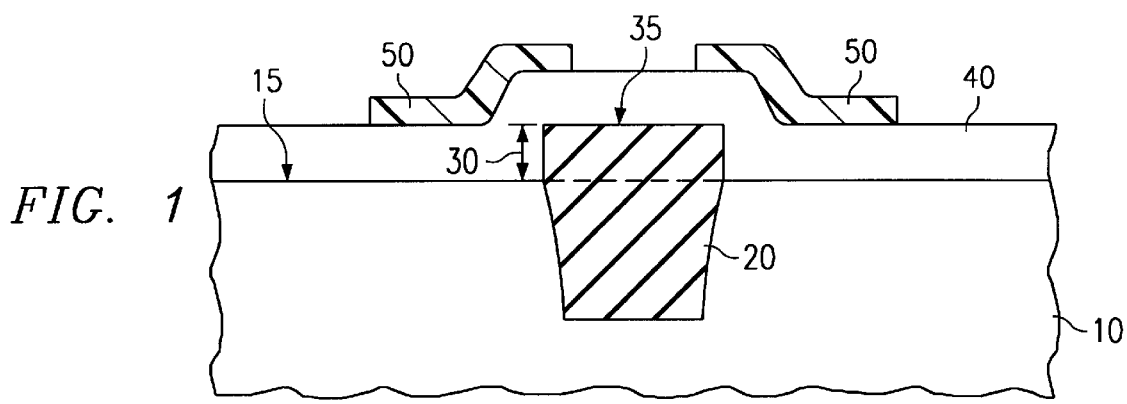
FIGS. 1–3 are cross-section and plan diagrams showing an embodiment of the instant invention.

Shown in FIG. 1 is a silicon substrate 10 in which a STI structure 20 has been formed. Etching a trench in the substrate 10 and filling the trench with a dielectric material forms the STI structure. The excess dielectric material remaining after filling the trench is removed using CMP. Following the CMP process the top surface of the STI structure 35 is usually above the upper surface of the silicon substrate 15 by a certain distance 30. This results in a step between the STI structure 20 and the surface of the silicon substrate. The distance which separates the top surface of the STI structure 35 and the upper surface of the silicon substrate 15 can be defined as a step height and is shown as 30 in FIG. 1. During the formation of MOS transistors, FLASH, DRAM or SRAM memory cells on the silicon substrate, polycrystalline (or polysilicon, or poly) silicon films are used to form various regions of these devices. For example the MOS transistor gate and various charge storage layers of the memory cells are formed using polysilicon films. In forming these various polysilicon regions, a blanket layer of polysilicon is usually formed on the wafer surface. A patterned photoresist film is formed on the blanket polysilicon film, which is then etched to form the required device layer using the patterned photoresist film as a mask. In forming the device that will be used to determine the step height 30, a blanket polysilicon film 40 is formed over the STI structure 20. This polysilicon film 40 can be the same film that is used to form the gate of a MOS transistor or one of the charge storage films of a memory device. The blanket polysilicon film 40 is implanted with a dopant species to make the polysilicon film conducting.

Figure 2:
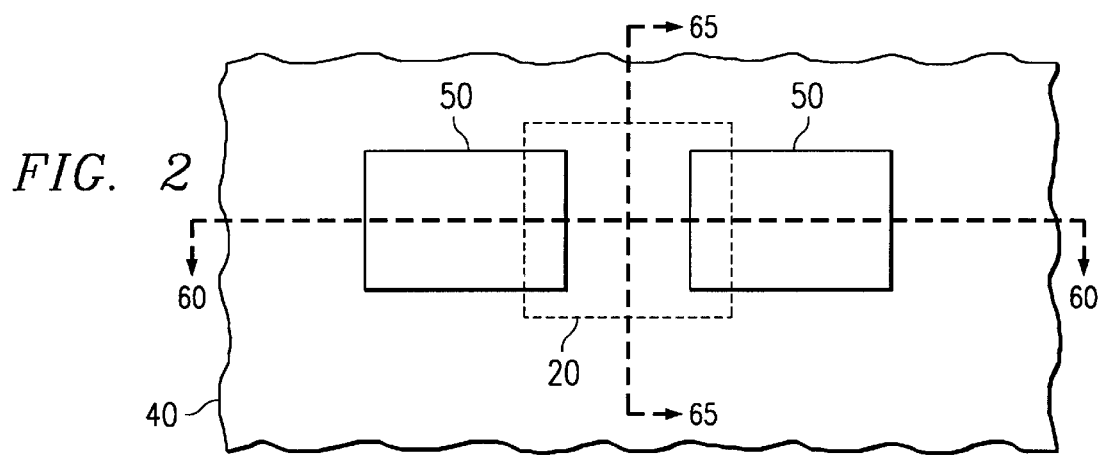

In an embodiment of the instant invention a patterned photoresist mask 50 is formed on the polysilicon film 40. These photoresist masks will define the contact area of the measurement device. A plan view of the structure is shown in FIG. 2. The patterned masks 50 over a portion of the polysilicon film 40 that overlies the STI structure 20. The cross-section shown in FIG. 1 is taken through the plane 60—60 shown in FIG. 2. Following the formation of the photoresist masks 50, an anisotropic polysilicon etch is performed to remove the unprotected regions of the polysilicon film 40. This anisotropic polysilicon etching process can be used to simultaneously form the measurement device and the polysilicon regions of MOS transistors or memory devices.

Figure 3A:
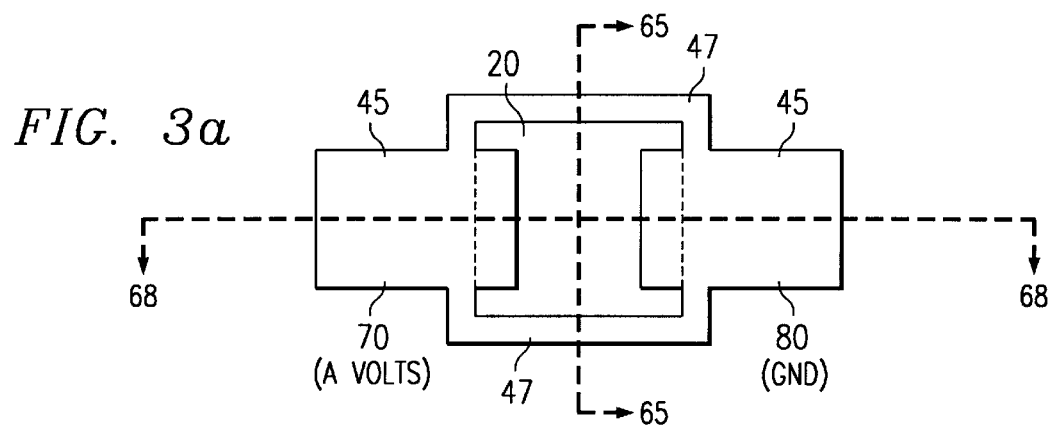
Figure 3B:
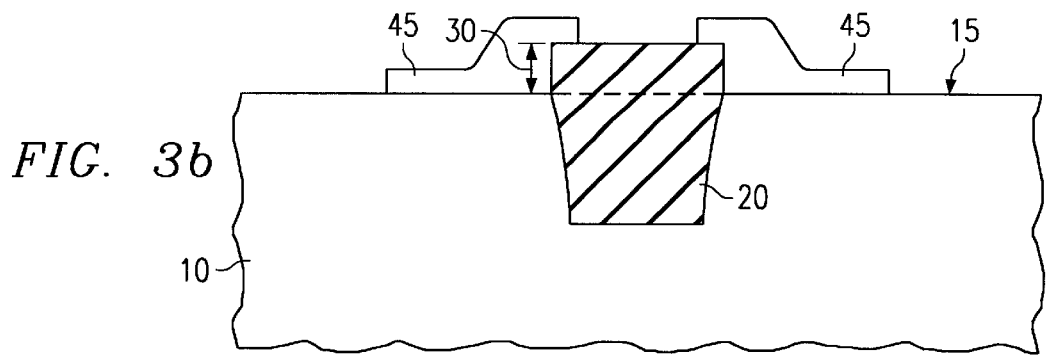
Figure 3C:
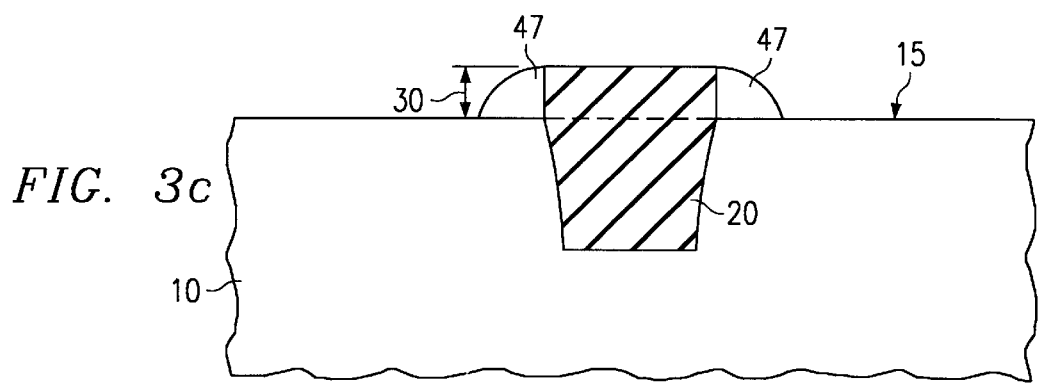

Shown in FIG. 3(a) is a plan view of the structure shown in FIG. 2 following the anisotropic polysilicon etch process and the removal of the photoresist masks. In FIG. 3(a), a contiguous polysilicon sidewall structure is formed 47 along with contact areas 45. A cross-section diagram taken in the plane 68—68 is shown in FIG. 3(b) and a cross-section diagram taken in the plane 65—65 is shown in FIG. 3(c). The contact areas 45 are illustrated in FIG. 3(b) and the polysilicon sidewall structure 47 is illustrated in FIG. 3(c).

In operation, a voltage of X volts is applied across the contacts 45. This can be achieved by applying X volts to 70 and 0 volts (or grounding) 80 as shown in FIG. 3(a). Applying this voltage will result in a current flowing through the polysilicon sidewall structures 47 which can be measured in an external circuit. The magnitude of the current flowing in the sidewall structures will depend on the electrical resistance (herein after resistance) of these structures 47. The resistance of the sidewall structures 47 will depend on; a) the resistivity $\rho$ of the polysilicon used to form the structures, b) the length of the sidewall structures, and c) the cross-section area of the sidewall structures. Because the cross-sectional area of the sidewall structures 47 is dependent on the step height, the current, which is measured for a given applied voltage, will be proportional to the step height.

Figure 4:
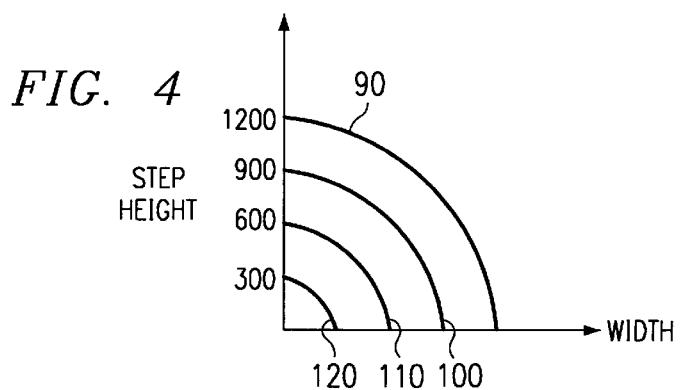
FIG. 4 is a plot showing the percentage change in resistance for a change in step height.

Shown in FIG. 4 is a plot of the step height versus the width of the sidewall structure. The cross-sectional area for a 1200 A step height and width is represented by 90. A reduction in step height from 1200 A to 900 A, represented by 100, will result in about a 44% change in cross-sectional area and the proportionate change in measured current. A 600 A step height 110 will result in a 75% change in cross-sectional area compared to a 1200 A step. Finally a 300 A step 120 will result in a 95% change in cross-sectional area and measured current.

Thus after forming the sidewall polysilicon device, the step height is measure by passing a voltage and measuring the corresponding current. Because the cross-section area and therefore the resistance of the sidewall polysilicon device is proportional to the step height, the step height can be calculated using Ohms law. In particular, let the resistivity of the polysilicon used to form the sidewall structure be given by $\rho$. The resistivity of the polysilicon used will depend on the implant dose of the dopant species and can be found using known tables in the art. For a length L of the sidewall polysilicon structure and a total cross-sectional area of A, the resistance of the sidewall structure, R, is given by $\rho L/A$. For the anisotropic process used to form the sidewall structures 47, the total cross-sectional area for both sides can be approximated by $(\pi h^2)/2$, where h is the step height 30. Using Ohms Law where the applied voltage X and the measured current I are related to the resistance R by R=X/I, the step height can be found as $h=(2\rho L/\pi R)^{1/2}$.

Figure 5A:
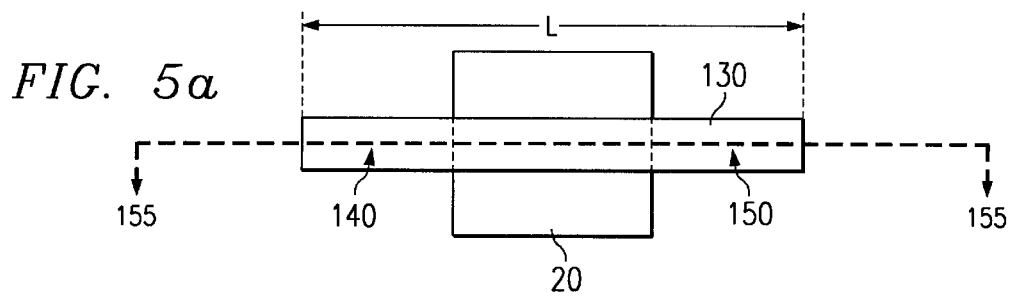
FIGS. 5(a)–5(b) are cross-section and plan diagrams showing a further embodiment of the instant invention.
Figure 5B:
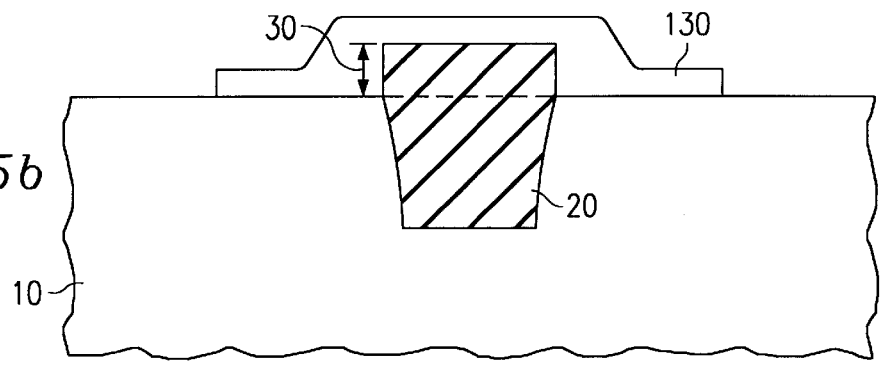

Shown in FIGS. 5(a) and 5(b) is another embodiment of the instant invention. Using the above-described processing steps a polysilicon strip 130 is formed across a STI structure 20 as shown in FIG. 5(a). A cross-section diagram taken through the plane 155 is shown in FIG. 5(b). The polysilicon strip crosses the STI structure and regions of the silicon substrate 10. In a manner similar to that described above, a voltage is applied across 140 and 150 and the corresponding current measured. As described above the resistance of the polysilicon strip 130 is given by $R_S=\rho L/A$, where L is the length of the strip, and A the cross-sectional area. Here the length of the strip includes the step height and variation in the step height will vary the resistance through L. Using Ohms law, $R_S=X/I$, where I is the measured current and X the applied voltage, the step height can be calculated.

Figure 6A:
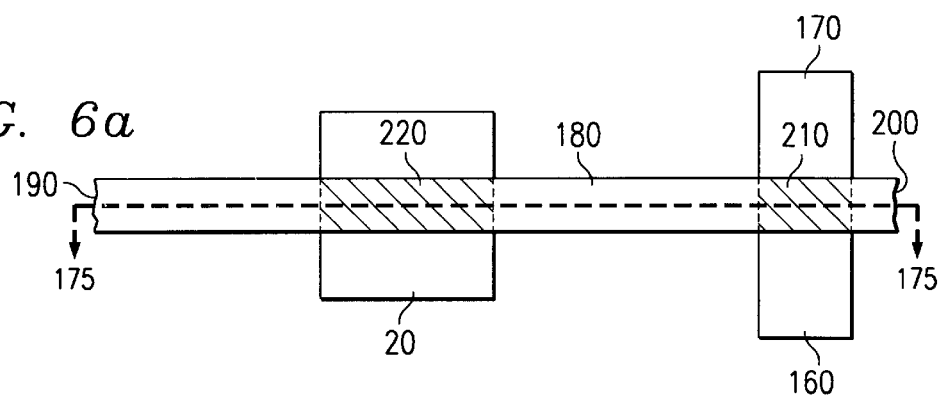
FIGS. 6(a)–6(b) are cross-section and plan diagrams showing a further embodiment of the instant invention.
Figure 6B:
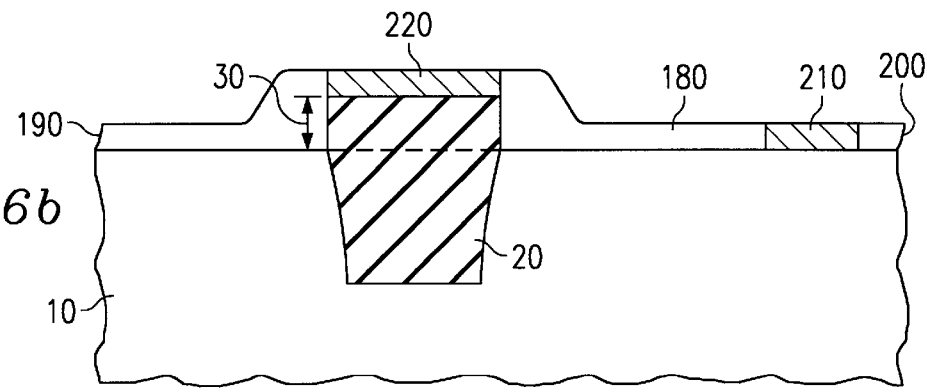

Shown in FIGS. 6(a)–6(b) is another embodiment of the instant invention. In this embodiment, a polysilicon strip 200 is used to simultaneously form the gate of a MOS transistor and cross a STI structure. As shown in FIG. 6(a) region 210 of the polysilicon strip 180 functions as the gate of a MOS transistor. The source 170 and the drain 160 of the MOS transistor are also shown in FIG. 6(a). The MOS transistor is formed using known methods in the art. Region 220 of the same polysilicon strip 180 crosses the STI structure 20. A cross-section diagram taken from the plane 175 of FIG. 6(a) is shown in FIG. 6(b). In using the structure shown in FIGS. 6(a) and 6(b) to measure the step height, a voltage is applied across 190 and 200. The voltage will be distributed along the polysilicon strip 180 and a portion of the applied voltage will appear across region 210 (the gate of the MOS transistor). The current flowing through the source and drain regions 170 and 160 of the MOS transistor is a very sensitive function of the voltage which appears across region 210 of the polysilicon strip. For a given applied voltage, the voltage, which appears across region 210, is a function of the resistance on the polysilicon strip 180. As described above, the resistance of a polysilicon strip that crosses a STI structure is proportional to the step height 30 of the STI structure 20. The voltage that appears across region 210 of the polysilicon strip 180 is therefore proportional to the step height 30. This proportionality between the voltage across region 210 and the step height 30 translates to the source and drain current of the MOS transistor. Therefore the source and drain current of the MOS transistor is proportional to the step height 30. By measuring the MOS transistor source and drain current for a given applied voltage across the polysilicon strip, the step height 30 of the STI structure 20 can be found. In addition, if the transistor source and drain current for the desired step height is known, changes in this step height will result in changes in the transistor source and drain current. Thus by monitoring changes in the transistor source and drain current, changes in the step height can be detected.

Although the present invention has been described with several embodiments, various changes and modifications may be suggested to one skilled in the art. It is intended that the present invention encompass such changes and modifications that follow within the scope of the appended claims.

We claim:

1. A method for determining the step height of an STI structure comprising:

providing a STI structure with a top surface in a silicon substrate with an upper surface wherein the top surface of said STI structure is above the upper surface of said silicon substrate by a first distance;

forming a polysilicon sidewall structure on said upper surface of said silicon substrate adjacent to said STI structure;

determining an electrical resistance of said polysilicon sidewall structure by applying a voltage across said polysilicon structure and measuring a resulting current; and determining said first distance using said electrical resistance of said polysilicon sidewall structure.

2. The method of claim 1 wherein said forming said polysilicon sidewall structure further comprises:

forming a blanket polysilicon film over on said silicon substrate which overlies said STI structure; and performing an anisotropic polysilicon etch to form polysilicon sidewall structures.

3. The method of claim 1 wherein the determining of said electrical resistance comprises dividing the voltage by the measured current.

4. The method of claim 3 wherein the determining of said first distance comprises substituting the electrical resistance into $(2\rho L/\pi R)^{1/2}$ where R is the electrical resistance.

5. A step height detection method, comprising:

providing a STI structure with a top surface in a silicon substrate with an upper surface wherein the top surface of said STI structure is above the upper surface of said silicon substrate by a first distance;

forming a MOS transistor in said semiconductor substrate with a polysilicon gate wherein the polysilicon gate overlies a portion of said STI structure; and applying a voltage across said polysilicon gate and measuring the resulting transistor source and drain current to determine the first distance.

6. The method of claim 5 further comprising using changes in the measured transistor source and drain current to monitor changes in the first distance.

* * * * *